United States Patent [19]

Takemae

[11] Patent Number: 4,513,304
[45] Date of Patent: Apr. 23, 1985

[54] SEMICONDUCTOR MEMORY DEVICE AND PROCESS FOR PRODUCING THE SAME

[75] Inventor: Yoshihiro Takemae, Yokohama, Japan

[73] Assignee: Fujitsu Limited, Kawasaki, Japan

[21] Appl. No.: 229,596

[22] PCT Filed: May 17, 1980

[86] PCT No.: PCT/JP80/00106
§ 371 Date: Jan. 12, 1981
§ 102(e) Date: Jan. 12, 1981

[87] PCT Pub. No.: WO80/02624
PCT Pub. Date: Nov. 27, 1980

[30] Foreign Application Priority Data

May 18, 1979 [JP] Japan ................................. 54-61227

[51] Int. Cl.³ ...................... H01L 29/78; H01L 27/02
[52] U.S. Cl. ................................ 357/23.6; 357/23.11; 357/41
[58] Field of Search ................... 357/23 C, 41, 23 CS

[56] References Cited

U.S. PATENT DOCUMENTS

| 3,996,658 | 12/1976 | Takei et al. | 357/23 C |
| 4,021,789 | 5/1977 | Furman et al. | 357/41 |
| 4,094,057 | 6/1978 | Bhattacharyya et al. | 357/54 |
| 4,115,795 | 9/1978 | Masuoka et al. | 357/23 C |
| 4,151,607 | 4/1979 | Koyanagi et al. | 357/23 C |
| 4,240,092 | 12/1980 | Kuo | 357/23 C |

OTHER PUBLICATIONS

Vogl, "Making a One-Device Memory Cell", IBM Technical Disclosure Bulletin, vol. 18, (5/76), pp. 3953-3954.

Primary Examiner—Gene M. Munson
Attorney, Agent, or Firm—Staas & Halsey

[57] ABSTRACT

In order to reduce the area of one-transistor/one-capacitor memory cells, silicon nitride is used as the dielectric film for the capacitors and the memory cells are isolated from each other by a combination of thick insulating films and field shield layers. In addition, the capacitor electrodes are formed in self-alignment with the patterning of the field shield layers and gate electrodes of transistors, so that the area of the capacitors need not be increased in order to compensate for the anticipated error in positioning the capacitor electrodes.

24 Claims, 11 Drawing Figures

SEMICONDUCTOR MEMORY DEVICE AND PROCESS FOR PRODUCING THE SAME

DESCRIPTION

Background of the Invention

The present invention relates to a semiconductor memory device, particularly one-transistor/one-capacitor-memory cells, and the process for producing the same.

In one-transistor/one-capacitor memory cells, one bit of the memory device is provided by one MOS transistor (1) and one memory capacitor (2), as illustrated in FIG. 1. The circuit of the one-transistor/one-capacitor-memory cell is the simplest structure in dynamic memory devices. As illustrated in FIG. 1, the gate of each MOS transistor (1) is connected to a word line (W) and the source of each MOS transistor (1) is connected to a bit line (B). The word lines (W) and the bit lines (B) perpendicularly cross each other in the plan view of the one-transistor/one-capacitor-memory device. One bit of the one-transistor/one-capacitor-memory cells has, for example, a structure such as illustrated in FIGS. 2A and 2B. In FIGS. 2A and 2B, which respectively illustrate the plan and cross sectional views of the one bit mentioned above, the reference numerals 3, 4 and 5 indicate a capacitor electrode, an insulating film for the capacitor consisting of silicon dioxide, and an electric charge-storing region of a silicon substrate, respectively.

The capacitor electrode (3), the insulating film (4) for the capacitor, and the charge-storing region (5) constitute an MOS capacitor. The capacitance of the MOS capacitor is determined by the capacitor electrode (3), the insulating film (4), and the charge-storing region (5). When the voltage applied to the capacitor electrode (3) is more than the threshold voltage of the electric charge-storing region (5), beneath the insulating film (4), electric charges are stored in this portion. The electric charges are caused to move from the electric-charge storing portion (5) to the source (7) in accordance with the potential applied to the gate electroce (6). The information "0" or "1" can be detected depending upon the movement or non-movement of the electric charges.

Each of the memory cells is surrounded by a thick insulating film (8) at the circumference thereof and is hence isolated from adjacent memory cells. The bit line (B) connects the sources (7) of the MOS transistors with each other. The gate electrode (6) of the MOS transistor is a portion of the word lines (W) shown in FIGS. 2A and 2B. It is known in U.S. Pat. No. 3,996,658 to overlap the gate electrode (6) over the capacitor electrode (3) in a memory cell of a semiconductor memory device.

In a memory cell having the conventional structure as explained above, an oxide film is usually used as the insulating film (4) for the capacitor. However, since the breakdown electric field of the oxide film is approximately from 2 MV/cm to 5 MV/cm, it is difficult to reduce the thickness of the oxide film from the conventional thickness, i.e. from 200 to 500 Å. Consequently, it is difficult to increase the capacitance per unit area of the insulating film higher than a certain value, which is the most serious impediment to reducing the size of the memory cell.

For the production of memory cells, it is necessary to repeat, several times, the steps of mask alignment using photolithographic techniques. It is necessary to reckon beforehand the error which occurs in the alignment of masks. The dimensions of the memory cells must be increased as a result of the error in the mask alignment.

The patterning (i.e., the defining of the borders) of the capacitor electrode (3), which consists of polycrystalline silicon, is particularly important for the dimensions of the memory cells. When the patterning of the insulating film (8) for isolation (which is carried out in the step preceeding the step of forming the capacitor electrode (3)) deviates from the proper theoretical position of the insulating film (8), the dimensions of the capacitor electrode (3), and hence the capacitance of the capacitor, can be smaller than that required. Accordingly, the insulating film (8) must be formed by taking into consideration the error in mask alignment, and the dimensions of the insulating film (8) must be the minimum required for the insulating film plus the maximum error in mask alignment. As a result, the area for one bit of the memory cell is increased.

SUMMARY OF THE INVENTION

It is an object of the present invention to eliminate the defects of the conventional semiconductor memory device which impede reduction of the size of the semiconductor memory device, and to provide a highly integrated semiconductor memory device.

It is another object of the present invention to provide a process for producing, by self-alignment, a semiconductor memory device having a small size.

According to the invention a semiconductor memory device, wherein each of the memory cells comprises one transistor and one memory capacitance region, is characterized in that:

each memory capacitance region comprises a capacitor which comprises (a) a silicon nitride film, (b) an electrode of said capacitor above the film, and (c) an electric charge-storing region under said film, the charge-storing region resulting from introduction doping agents or impurities into a semiconductor body; and, further, said memory cells are isolated from each other by a combination of thick insulating films and field shield layers, which films and layers extend in directions perpendicularly crossing with each other.

Since a silicon nitride ($Si_3N_4$) film is used as the insulating film for the capacitor in the semiconductor memory device of the present invention, and further, since the dielectric constant of the silicon nitride film is from 1.5 to 2 times of a silicon dioxide ($SiO_2$) film, it is possible to reduce the area of and increase the capacitance of the capacitor in the present invention, as compared with capacitors using a silicon dioxide film. The silicon nitride film used for the capacitor permits a high capacitance, but the threshold voltage (Vth) of the interface is high, because the crystal properties of the silicon nitride film are inferior to those of a silicon dioxide film, with the result that the interface between the silicon nitride film and the silicon substrate is caused to be irregular. The electric charge corresponding to the threshold voltage (Vth) is not stored on the surface of the silicon substrate. Accordingly, if the threshold voltage (Vth) becomes high, the amount of the stored electric charge becomes small. In order to stabilize the threshold voltage (Vth) at a low level, the electric charge-storing region of the present invention is fabricated by introduction into the storing region of impurities having a conductivity type (i.e., either N or P doping) opposite to that of the silicon substrate.

The field shield layers are electrically conductive lines of polycrystalline silicon and are operated as isolation zones, each of which isolate or cut off two neighbouring regions of the silicon substrate. The field shield layers are always connected to a ground potential, a back gate bias potential or an electric potential which can realize the isolation mentioned above.

A process for producing a semiconductor memory device according to the present invention comprises the steps of:

forming a plurality of thick insulating films on a semiconductor substrate having a first conductivity type, in such a manner that the thick insulating films extend in a first direction;

forming thin insulating films on the semiconductor substrate between the thick insulating films;

simultaneously forming (a) first conductive layers for field shield layers and (b) second conductive layers for word lines, in such a manner that the first and second conductive layers extend in a second direction essentially perpendicular to the first direction;

removing the thin insulating film using the first and second conductive layers as masks, thereby exposing portions of said semiconductor substrate;

introducing impurities of the second conductivity type into the exposed portions of the semiconductor substrate using the first and second conductive layers as masks, thereby forming electric charge-storing regions; and forming on the electric charge-storing regions insulating films of silicon nitride for capacitors and forming capacitor electrodes on the insulating films.

Since in the process of the present invention the field shield layers and the gate electrodes of the MOS transistors are simultaneously formed by patterning of polycrystalline silicon, and further, since the capacitors are formed by self alignment with such patterning, the area of the capacitors is always constant, and is not dependent upon the patterning accuracy of capacitor electrodes. Although it is necessary in the conventional process to calculate the mask alignment error, in addition to the minimum required dimensions of the insulating film, only the minimum required dimensions are needed in the present invention for patterning the spaces between the field shield layers and the gate electrodes, on which spaces the insulating films for capacitors are later formed. In addition, impurities having a conductivity type opposite to that of the substrate are introduced, by self alignment with the patterning of the first and second conductive masks, into the portions of the substrate where the capacitors are to be formed, so that a silicon nitride film having a high dielectric constant can be used as the insulating film for the capacitor. Accordingly, the capacitance per unit area of the memory cells is high. The field shield layers are formed simultaneously with the production of the gate electrodes. In addition, the impurities having a conductivity type opposite to that of the substrate are introduced, by self-alignment, into the portions of the substrate where the capacitors are to be formed. Furthermore, the capacitor electrodes are formed above these regions where impurities were introduced. Accordingly, no additional steps over those of the conventional process are added in the production process described hereinabove.

DESCRIPTION OF THE PREFERRED EMBODIMENTS

Figure 1:
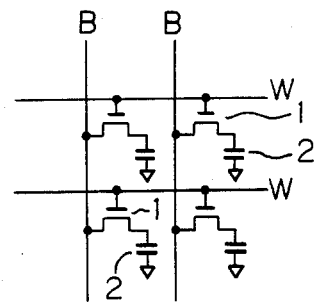
FIG. 1 illustrates an example having circuit of a one-transistor/one-capacitor memory cells.
Figure 2A:
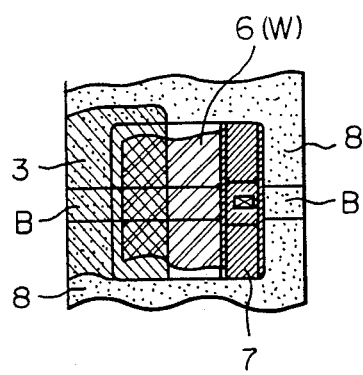
FIGS. 2A and 2B illustrate, respectively, a plan view and a cross sectional view of a conventional one-transistor/one-capacitor memory cell.
Figure 2B:
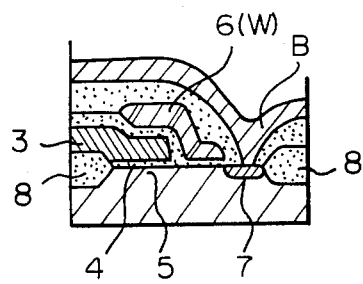
Figure 3A:
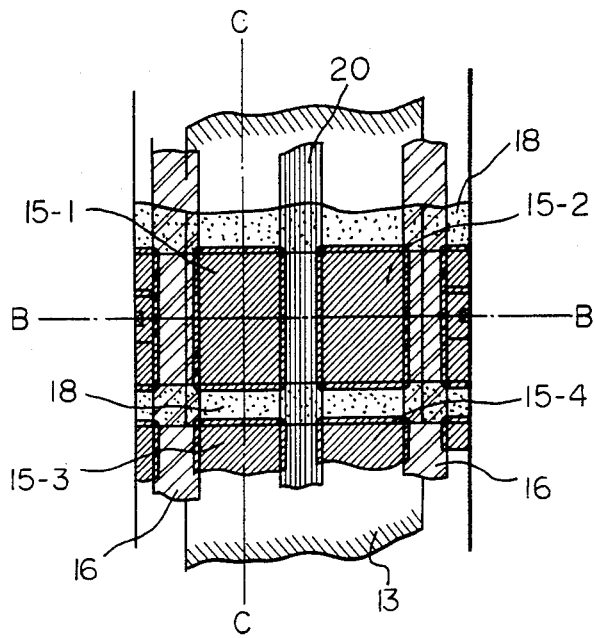
FIGS. 3A, 3B and 3C illustrate, respectively, a plan view, a cross sectional view along line B—B in FIG. 3A, and cross sectional view along line C—C in FIG. 3A, of memory cells according to an embodiment of the present invention.

An embodiment of the one-transistor/one-capacitor memory cells, according to the present invention, is illustrated hereinafter with reference to FIGS. 3A, 3B and 3C. In FIG. 3A a plan view of the memory cell is illustrated, and in FIGS. 3B and 3C cross sectional views of the memory cell in the bit line direction and in the word line direction, respectively, are illustrated. The memory capacitance region comprises a capacitor electrode (13) an insulating film (14) consisting of silicon nitride and a diffusion layer, i.e., the electrode charge-storing region (15) having a conductivity type (second conductivity type) opposite to that (first conductivity type) of the silicon substrate (10).

Figure 3B:
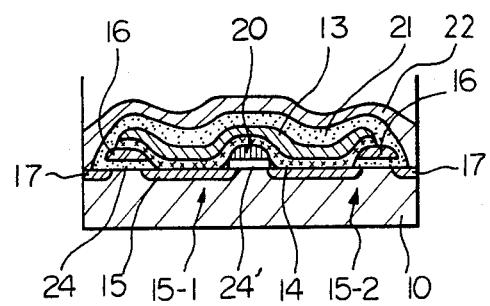
Figure 3C:
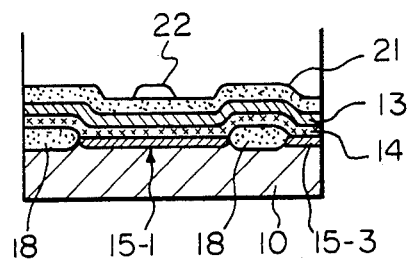

In FIG. 3B, there are illustrated two bits of the memory cells (15-1 and 15-2) which are arranged in the bit line direction, and these memory cells are isolated from each other by a field shield layer (20) consisting of polycrystalline silicon and positioned between the memory cells. Two bits of the memory cells (15-1 and 15-3, FIG. 3A) are arranged in the word line direction and are isolated from each other by a thick insulating film (18). The word lines (16) comprise portions which constitute gate electrodes of MOS transistors and portions which extend across the thick insulating films (18) to electrically connect the gate electrodes of adjacent transistors with each other. The latter portions, i.e. electrically conductive lines, extend on the thick insulating film (18) and the former positions, i.e. the gate electrodes, extend on the insulating film (14) of thin silicon nitride.

On the capacitor electrode (13) of the memory cells, isolated from each other as described hereinabove, an insulating film (21) is deposited, and apertures exposing the source regions (17) of the MOS transistors are formed through the insulating film (21). Bit lines (22) are then formed on the insulating film (21), which bit lines connect the source regions (17) of the memory cells with each other.

In the memory cell described above, the area of the electric charge-storing region (15) is slightly greater than the area of the rectangular surface region which is surrounded by:

a pair of thick insulating films (not shown) extending in a first direction (the bit line direction);

a gate electrode (16) of a MOS transistor extending in a second direction (the word line direction); and a field shield layer (20) extending in the second direction.

These insulating films, the gate electrode and the field shield layer are collectively referred to as the isolating boundary.

In addition, the insulating film (14) for the capacitor and the capacitor electrode (13) completely cover the surface region of silicon substrate surrounded by the insulating boundary, and the ends of the capacitor electrode (13) and the insulating film (14) terminate on insulating boundaries. Accordingly, the patterning accuracy of the capacitor electrode (13) does not determine the amount of electric charge applied from the electrode (13) to the insulating film (14), but merely determines the ends of the electrode (13).

The insulating film (24') beneath the field shield layer (20) has the same thickness as and consists of the same material as the gate insulating film (24). Accordingly, the insulating film (24') can be formed simultaneously with the gate insulating film (24) and hence no additional step is required for the formation of the insulating film (24') as compared with the production of an MOS transistor.

The thicknesses of the thick insulating films (18) and the insulating films (14) of silicon nitride are preferably from 5000 to 20000 U and from 200 to 500 Å, respectively. The dimensions of the individual electric charge-storing regions or the surface areas of individual insulating films (14) are such that the capacitance of the individual capacitors having the silicon nitride films (14) is 0.02 PF at the minimum in 64k bit memory cells.

An embodiment of the process according to the present invention is hereinafter explained with reference to FIGS. 4A through 4E, illustrating the production steps in the sequence therof. FIGS. 4A through 4E are cross sectional drawings in the bit line direction, as in FIG. 3B.

First, the thick insulating films (18) (c.f. FIGS. 3A and 3C, not shown in FIGS. 4A through 4E) are formed on a silicon substrate (10) for the isolation of memory cell regions along the first direction (the bit line direction) and, then, thin insulating films (19) (FIG. 4A) are formed on the portions of the silicon substrate where the thick insulating films (18) have not been formed. The thick insulating films (18) can be formed by a known local oxidation process, while the thin insulating films (19) (of silicon dioxide) can be formed by a known thermal oxidation process.

Figure 4A:
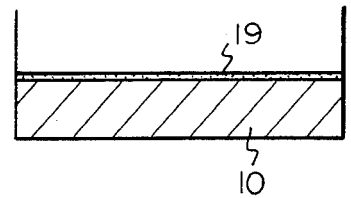
FIGS. 4A through 4E illustrate production steps for producing memory cells according to an embodiment of the process of the present invention.
Figure 4B:
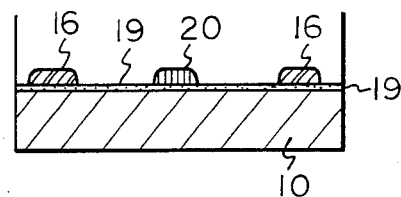
Figure 4C:
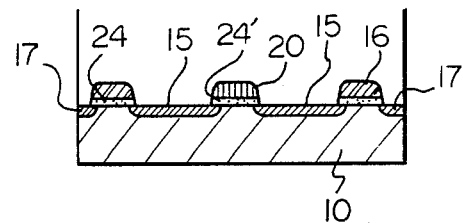

A polycrystalline silicon layer is subsequently deposited by a CVD process on the silicon substrate (10), on which the insulating films (18) and (19) are formed, and is patterned to simultaneously form the word lines (16) (including gate electrodes) and the field shield layers (20) as illustrated in FIG. 4B. The word lines (16) and the field shield layers (20) extend in the second direction (the word line direction), which is essentially perpendicular to the first direction, and extend over the thick insulating films (18) (not shown).

Subsequently, the insulating film (19), exposed as shown in FIG. 4B, is removed by etching and, thereafter, the diffusion layers (15) for the storage of electric charges and source regions (17) for MOS transistors are simultaneously formed by introducing impurities having the second conductivity type, or the conductivity type opposite to that (the first conductivity type) of the silicon substrate (10), into the silicon substrate exposed by the removal of the insulating film (19). For the introduction of the impurities, the diffusion process or the ion implantation process can be used.

Figure 4D:
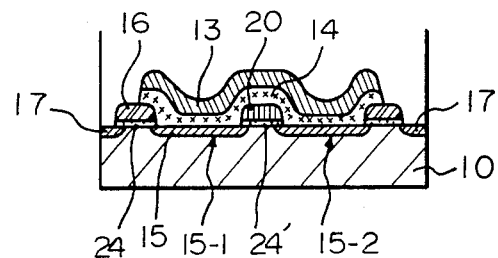
Figure 4:
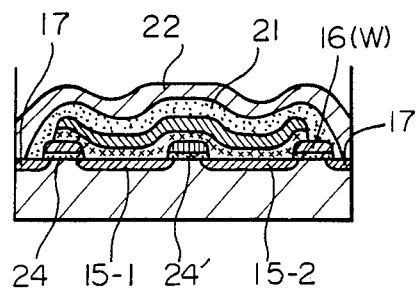

Subsequently, a thin layer of silicon nitride and a polycrystalline silicon layer are successively deposited over the silicon substrate (10) and are patterned as illustrated in FIG. 4D, so as to form the silicon nitride insulating film (14) for the capacitor and the polycrystalline silicon capacitor electrode (13) of the two adjacent memory cells (15-1 and 15-2). The patterning accuracy of the silicon nitride insulating film (14) and the polycrystalline silicon capacitor electrode (13) does not exert any influence on the capacitance of the capacitor having the thin layer of silicon nitride. It is permissible to position between each diffusion layer (15) and each silicon nitride insulating film (14) a thin film (not shown) of silicon dioxide. The thickness of this thin film of silicon dioxide should be as thin as possible, because the thickness of the capacitor is increased due to the thin film of silicon dioxide.

Subsequently, as illustrated in FIG. 4E, an insulating film (21) is deposited on the entire surface of the silicon substrate subjected to the production steps illustrated in FIGS. 4A through 4D, and apertures are then opened through the insulating film (21) at the source regions (17) of the MOS transistors. Aluminum is subsequently deposited on the insulating film (21) by an evaporation or sputtering process and patterned to form the bit lines (22) including the electrodes of the source regions (17).

The present invention is industrially applicable to the production of the ICs and LSIs, as the ICs and LSIs have a reduced size and are more highly integrated than in the conventional ICs and the like, because the one-transistor/one-capacitor memory cell is provided with an optimum structure for high integration due to the silicon nitride film for the capacitor and the field shield layers, and further such cells can be produced as simply as in the conventional production steps for one-transistor/one-capacitor memory cells.

Obviously the present invention can be applied to any memory cells in which the transfer and storage of electric charges are realized by P or N channels (P or N conductivity type diffusion layers).

What is claimed is:

1. An improved semiconductor memory device of the type wherein a plurality of memory cells are fabricated on a semiconductor substrate having a first conductivity type, each memory cell including an MOS transistor having a gate electrode insulated from the substrate by a first insulating film and an MOS capacitor, wherein the improvement comprises:

each MOS capacitor comprises (a) a second insulating film of silicon nitride, (b) a capacitor electrode on one side of the second film, said second film additionally extending between the gate and capacitor electrodes to insulate one from the other, and (c) an electric charge storing region in the substrate on the other side of the second film, the charge-storing region including impurities introduced into the substrate so that the charge-storing region has a second conductivity type that is opposite that of the first conductivity type; and a combination of thick insulating films and field shield layers isolating the memory cells from each other, which films and layers extend in directions perpendicularly crossing with each other, each field shield layer being insulated from the substrate by a film having substantially the same composition and thickness as said first insulating film.

2. A semiconductor memory device according to claim 1, wherein the area of each of said electric charge-storing regions is slightly greater than the area of the semiconductor substrate surface surrounded by (d) a pair of said thick insulating films extending in a first direction, (e) the gate electrode of said MOS transistor, extending in a second direction perpendicular to said first direction, and (f) said field shield layer extending in said second direction.

3. A semiconductor memory device according to claim 2, wherein said second film (a) and said capacitor electrode (b) completely cover the surface region of said semiconductor substrate surrounded by (d) said pair of said thick insulating films, (e) said gate electrode, and (f) said field shield layer.

4. A semiconductor memory device according to claim 1 or 2, wherein
said field shield layers consist of polycrystalline silicon.

5. A semiconductor memory device according to claim 1, wherein said first insulating film consists essentially of an oxide film.

6. A semiconductor memory device according to claim 1, wherein said second insulating film of silicon nitride touches both the capacitor electrode and the charge-storing region.

7. A semiconductor memory device according to claim 1, wherein said second insulating film includes a layer of oxide that is thinner than the silicon nitride.

8. A MOS memory device fabricated on a semiconductor substrate having a first conductivity type, the memory device having a plurality of memory cells each comprising:
a source region in the substrate, the source region having a doping agent embedded therein so that the source region has a second conductivity type that is opposite that of the first conductivity type;
an electric charge-storing region in the substrate spaced apart from the source region, the electric charge-storing region having embedded therein a doping agent of the same type that is embedded in the source region so that the electric charge-storing region has said second conductivity type;
a gate electrode disposed above the substrate between the source region and the electric charge-storing region;
first means for insulating the gate electrode from the substrate;
a capacitor electrode disposed above the substrate over the electric charge-storing region;
second means for insulating the capacitor electrode from the substrate and the gate electrode, said second means being different from said first means in composition;
wherein the second means comprises a film, with a higher dielectric constant than that of silicon dioxide, disposed between the capacitor electrode and both the electric charge-storing region and the gate electrode.

9. The device of claim 6, wherein the film comprises silicon nitride.

10. The device of claim 6 or 8, wherein the electric charge-storing region is shaped substantially like a parallelogram and wherein the gate electrode is an elongated conductor disposed substantially parallel to one side of the parallelogram, and further comprising first elongated means disposed above the substrate adjacent the side of the parallelogram opposite the gate electrode and substantially parallel thereto for isolating the electric charge-storing region from another of the plurality of memory cells.

11. The device of claim 10, further comprising second elongated means disposed above the substrate and parallel with one of the remaining sides of the parallelogram for isolating the electric charge-storing region from another of the plurality of memory cells.

12. The device of claim 11, wherein the first elongated means comprises an elongated field shield electrode disposed above the substrate and insulated therefrom by means having substantially the same composition and thickness as said first means.

13. The device of claim 12, wherein both the gate electrode and the field shield electrode extend over the second elongated means.

14. The device of claim 12, wherein the second elongated means comprises an elongated insulating layer disposed on the substrate.

15. The device of claim 11, wherein said first means consists essentially of an oxide film.

16. The device of claim 15, wherein said second means additionally comprises an oxide film that is thinner than the silicon nitride.

17. An MOS memory device fabricated on a semiconductor substrate having a first conductivity type, the memory device having a plurality of memory cell pairs, at least one of the memory cell pairs comprising:
first and second source regions disposed in the substrate at spaced apart positions, said source regions having a second conductivity type that is opposite that of said first conductivity type;
first and second electric charge-storing regions disposed adjacent each other in the substrate between the first and second source regions, the first electric charge-storing region being positioned adjacent to and spaced apart from the first source region and the second charge-storing region being positioned adjacent to and spaced apart from the second source region, said charge-storing regions having said second conductivity type;
means for isolating the first and second charge-storing regions from each other;
a first gate electrode disposed above the substrate substantially between the first source region and the first electric charge-storing region;
first means disposed between the substrate and the first gate electrode for insulating the first gate electrode from the substrate;
a second gate electrode disposed above the substrate substantially between the second source region and the second electric charge-storing region;
second means disposed between the substrate and the second gate electrode for insulatng the second gate electrode from the substrate, said second means having substantially the same composition and thickness as said first means;
a capacitor electrode positioned above the substrate and extending between the first and second gate electrodes, the capacitor electrode having a first border positioned above the first gate electrode and a second border positioned above the second gate electrode;
silicon nitride means for insulating the capacitor electrode from the first and second gate electrodes and from the first and second electric charge-storing regions, said silicon nitride means being different from said first and second means in composition an insulating layer extending from the first source region to the second source region over the capacitor electrode; and a conductor extending over the insulating layer and electrically connecting the first and second source regions.

18. The device of claim 15, wherein the first gate electrode is an elongated conductor and the second gate electrode is an elongated conductor substantially parallel to the first gate electrode.

19. The device of claim 16, further comprising first elongated means traversing the first and second gate electrodes for isolating the first and second electric charge-storing regions from the electric charge-storing regions of other memory cells, and second elongated means traversing the first and second gate electrodes for isolating the first and second electric charge-storing regions from the electric charge-storing regions of other memory cells, the second elongated means being spaced apart from the first elongated means and substantially parallel thereto, the first and second electric charge-storing regions being substantially confined within the region bounded by the first and second gate electrodes and the first and second elongated means.

20. The device of claim 17, wherein the capacitor electrode extends over the substrate between the first and second elongated means and traverses the first and second elongated means.

21. The device of claim 18, wherein the means for isolating the first and second electric charge-storing regions comprises an elongated field-shield electrode disposed over the substrate substantially parallel to the first and second gate electrodes and substantially between the first and second electric charge-storing regions, and third means for insulating the field shield electrode from the substrate, said third means having substantially the same composition and thickness as said first and second means.

22. The device of claim 19, wherein said first, second, and third means consist essentially of oxide films.

23. The device of claim 19, wherein the first and second elongated means comprise first and second elongated insulators deposited on the substrate, the first and second gate electrodes and the field shield electrode extending over both the first and second elongated insulators.

24. The device of claim 15, 16, 17, 18, 19, and 20, wherein the first and second source regions have the same type of doping agent embedded therein, and further comprising doping agent embedded in the first and second electric charge-storing regions, the doping agent embedded in the first and second charge-storing region being of the same type that is embedded in the first and second source regions so that the source regions and charge-storing regions all have the second conductivity type.

* * * * *

UNITED STATES PATENT AND TRADEMARK OFFICE
CERTIFICATE OF CORRECTION

PATENT NO. : 4,513,304

DATED : Apr. 23, 1985

INVENTOR(S) : YOSHIHIRO TAKEMAE

It is certified that error appears in the above-identified patent and that said Letters Patent is hereby corrected as shown below:

Page 1 of 2

Column 1, line 9, "tor-memory" should be --tor memory--;
              line 14, "one-capacitor-" should be --one-capacitor--;
              line 21, "capacitor-memory" should be --capacitor memory--;
              line 22, "capacitor-memory" should be --capacitor memory--.

Column 2, line 10, "preceeding" should be --preceding--;
              line 40, after "introduction" insert --of--;
              line 51, after "times" insert --that--.

Column 4, line 3, "having" should be --of a--; "of a" should be --having--;
              line 29, "electrode" should be --electric--.

Column 5, line 24, "u" should be --$\overset{o}{A}$--;
              line 33, "therof" should be --thereof--.

Column 6, line 54, "charge storing" should be --charge-storing--.

Column 7, line 59, change "6" to --8--;
              line 61, change "6" to --8--; change "8" to --9--.

Column 8, line 68, after "composition" insert --;--.

Column 9, line 7, change "15" to --17--;
              line 10, change "16" to --18--;
              line 26, change "17" to --19--.

UNITED STATES PATENT AND TRADEMARK OFFICE
CERTIFICATE OF CORRECTION

PATENT NO. : 4,513,304

DATED : Apr. 23, 1985

INVENTOR(S) : YOSHIHIRO TAKEMAE

It is certified that error appears in the above-identified patent and that said Letters Patent is hereby corrected as shown below:

```
Column 10, line 1, change "18" to --20--;
           line 11, change "19" to --21--;
           line 13, change "19" to --21--;
           line 19, change "15, 16, 17, 18, 19, and 20" to
--17, 18, 19, 20, 21, and 23--;
           line 24, "region" should be --regions--.
```

Signed and Sealed this

Eighth Day of October 1985

[SEAL]

*Attest:*

*Attesting Officer*

DONALD J. QUIGG

*Commissioner of Patents and Trademarks—Designate*